United States Patent [19]

Dunphy et al.

[11] 4,300,063
[45] Nov. 10, 1981

[54] MULTIPLE INPUT WINDOW DETECTOR

[75] Inventors: Daniel L. S. Dunphy; Mark B. Kearney, both of Kokomo, Ind.

[73] Assignee: General Motors Corporation, Detroit, Mich.

[21] Appl. No.: 97,351

[22] Filed: Nov. 26, 1979

[51] Int. Cl.³ ............................................... H03K 5/24
[52] U.S. Cl. ..................................... 307/355; 307/360
[58] Field of Search ........... 307/360, 362, 355, 299 A, 307/299 B; 328/135, 147, 150

[56] References Cited

U.S. PATENT DOCUMENTS

| 3,816,761 | 6/1974 | Ahmed | 307/360 |
| 3,863,208 | 1/1975 | Balban | 340/52 H |
| 4,016,426 | 4/1977 | Nishioka | 307/10 R |
| 4,061,932 | 12/1977 | Cordell | 307/360 |
| 4,149,160 | 4/1979 | Bozarth et al. | 307/360 |

*Primary Examiner*—John Zazworsky
*Attorney, Agent, or Firm*—Albert F. Duke

[57] ABSTRACT

A multiple input window detector is disclosed which includes a balance pair of common base PNP transistors having multiple emitters connected to respective inputs for comparing either input to an upper threshold level established by a voltage divider. A pair of common emitter PNP transistors compare the inputs to a lower threshold level. The two outputs of each comparator are interconnected and the combined currents control an output stage which is driven to one state when both inputs are within the window established by the divider and is driven in the other state if either input is outside the window.

3 Claims, 5 Drawing Figures

MULTIPLE INPUT WINDOW DETECTOR

FIELD OF THE INVENTION

This invention relates to window detector circuits and, more particularly, to a circuit for detecting whether any one of two or more inputs are out of tolerance.

BACKGROUND OF THE INVENTION

Various circuits, designated window detectors, have been proposed in the prior art which determine whether an input signal is within or outside upper and lower threshold levels. It is often necessary to make this determination relative to a multiplicity of inputs. For example, in air cushion restraint systems it is desirable to monitor the condition of the firing circuit to provide an indication to the operator of any malfunction which might render the firing circuit inoperable in the event of a collision. The firing circuit is a series circuit comprising two normally open acceleration responsive switches which connect the two sides of a plurality of parallel connected detonators between the vehicle battery and ground. Large resistors are connected in parallel with the switches and establish a monitoring current in the series circuit below that required to activate the detonators. The voltage existing at a junction in each detonator circuit is monitored to detect any out of tolerance condition.

Conventionally a two comparator window detector is required for each monitoring point to determine if the voltage being monitored is outside the upper or lower threshold limit of the window detector. When multiple points are to be monitored, multiple window detectors are required with the individual outputs being logically connected to provide a single output. This approach results in complex and costly circuitry.

SUMMARY OF THE INVENTION

With the foregoing in mind it is an object of the present invention to provide a multiple input window detector of relatively simple design and high accuracy.

It is another object of the present invention to provide a multiple input window detector circuit configuration particularly suitable for use in integrated circuit form.

The window detector of the present invention includes a resistive divider network which sets the upper and lower threshold references ratiometric with the detector supply voltage. The detector includes two comparators which compare the respective upper and lower threshold reference levels to the various input signals. One comparator comprises a balance pair of common base PNP transistors. The multiple input signals are connected to respective ones of multiple emitter electrodes of one of the PNP pair which performs an OR function against the upper window reference applied to each emitter of the other PNP pair. The second comparator comprises a pair of common emitter PNP transistors. Each input is applied to the base of one PNP transistor. The lower threshold level is applied to the base of the other PNP transistor. The two outputs of each of the comparators are wire ANDed and their combined currents are mirrored to a cross-coupled PNP pair of transistors. The outputs of the cross-coupled PNP pair are fed to a double to single ended converter which drives an output transistor to produce one output level if all the inputs are within the window and a second output level if any of the inputs are outside the window.

A more complete understanding of the present invention may be had from the following detailed description which should be read in conjunction with the drawings, in which:

DESCRIPTION OF THE PREFERRED EMBODIMENT

Figure 1:
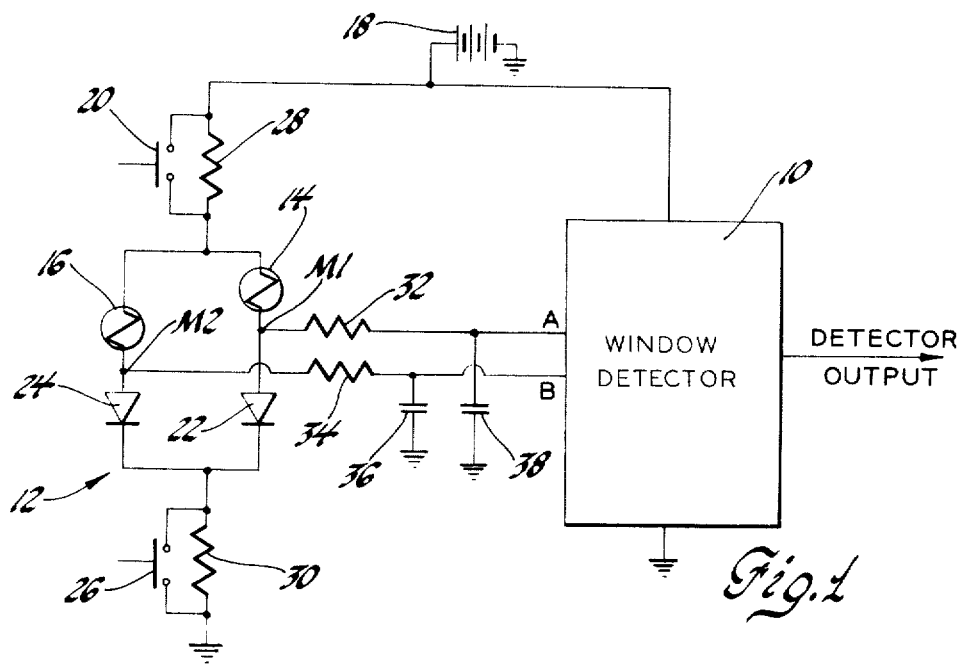
FIG. 1 is a schematic diagram of a detonator firing circuit providing inputs to the window detector of the present invention.

Referring now to the drawings and initially to FIG. 1, the window detector of the present invention is indicated generally by the reference numeral 10. The window detector 10 monitors two junctions M1 and M2 in an air cushion restraint system firing circuit generally designated 12. The circuit 12 comprises detonators 14 and 16 which are connected to a battery 18 through a normally open acceleration responsive switch 20. The circuit through the squibs 14 and 16 is completed to ground through steering diodes 22 and 24 and a normally open acceleration responsive switch 26. The switches 20 and 26 are in parallel with current limiting resistors 28 and 30. Current limiting resistors 32 and 34 connect junction points M1 and M2 to the inputs A and B, respectively, of the window detector 10. The inputs A and B are connected to ground through filter capacitors 36 and 38.

Figure 2:
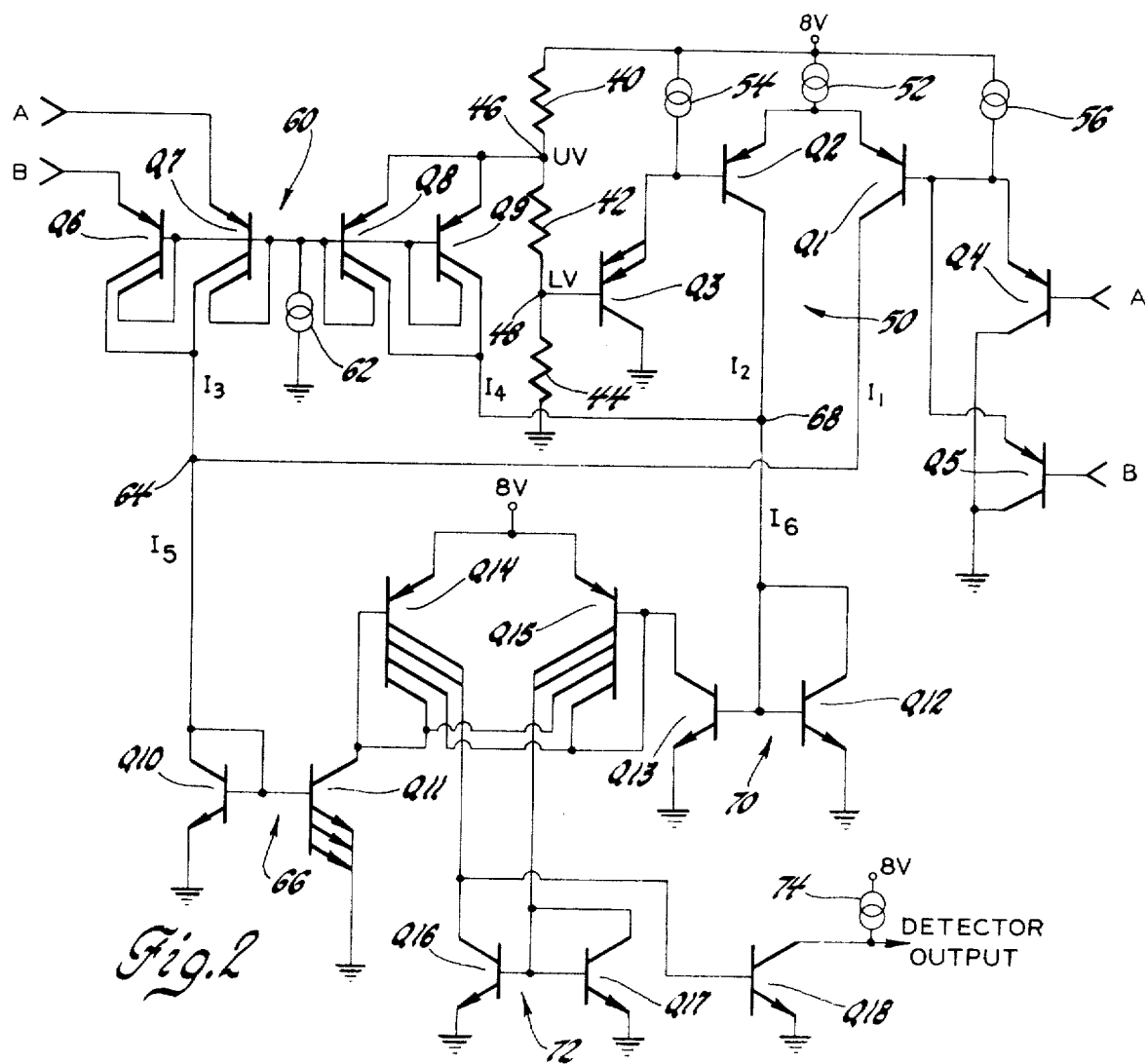
FIG. 2 is a detailed schematic of the window detector of FIG. 1.

Referring now to FIG. 2, the window detector 10 is shown to comprise a voltage divider network comprising resistors 40, 42 and 44 which establish an upper voltage reference UV of 5 volts at the junction 46 and a lower reference voltage LV of 3 volts at the junction 48. A common emitter differential transconductance stage generally designated 50 produces first and second output currents designated $I_1$ and $I_2$, which are differentially related to the difference between the lower reference voltage LV and the lower of the two input signals A and B. The stage 50 comprises PNP transistors Q1 and Q2 having their emitters connected to a 10 $\mu$A current source 52. The base of transistor Q2 is connected to the emitters of a PNP transistor Q3 and to a 6 $\mu$A current source 54. The collector of Q3 is grounded and its base is connected to the junction 48. The input signals A and B are applied in parallel to the base of transistor Q1 through the emitter base region of PNP buffer transistors Q4 and Q5. The transistors Q4 and Q5 have their emitters connected to a 6 $\mu$A current source 56.

A common base differential transconductance stage generally designated 60 produces third and fourth output currents designated $I_3$ and $I_4$, respectively, which are differentially related to the difference between the upper reference voltage UV and the higher of the two input signals A and B. The stage 60 comprises lateral PNP transistors Q6–Q9 having a common base connected to a 10 $\mu$A current source 62. The emitters of transistors Q8 and Q9 are connected to the junction 46 while the emitters of transistors Q6 and Q7 are connected with the inputs A and B, respectively. Each of the transistors Q6–Q9 has a first collector region connected with the common base region.

The currents $I_1$ and $I_3$ are summed at the junction 64 and applied to a current mirror 66 comprising NPN transistors Q10 and Q11. The emitter of Q11 is scaled for conducting approximately three times the current conducted by Q10. The currents $I_2$ and $I_4$ are combined at the junction 68 and applied to current mirror 70 comprising NPN transistors Q12 and Q13. The outputs of the current mirrors 66 and 70 are applied to a cross-coupled pair of PNP transistors Q14 and Q15. Each of the transistors Q14 and Q15 are connected as current mirrors and each has a pair of collectors tied together to provide outputs which are twice the current outputs of the mirrors 66 and 70, respectively. The output of transistor Q15 is applied to a current mirror 72 comprising NPN transistors Q16 and Q17. An NPN output transistor Q18 is connected to a current source 74 and has its base connected to the collectors of Q14 and Q16. Transistor Q18 is driven by the difference between the collector currents of Q14 and Q16. The collector current of Q16 is in turn determined by the collector current of Q15.

Figure 3:
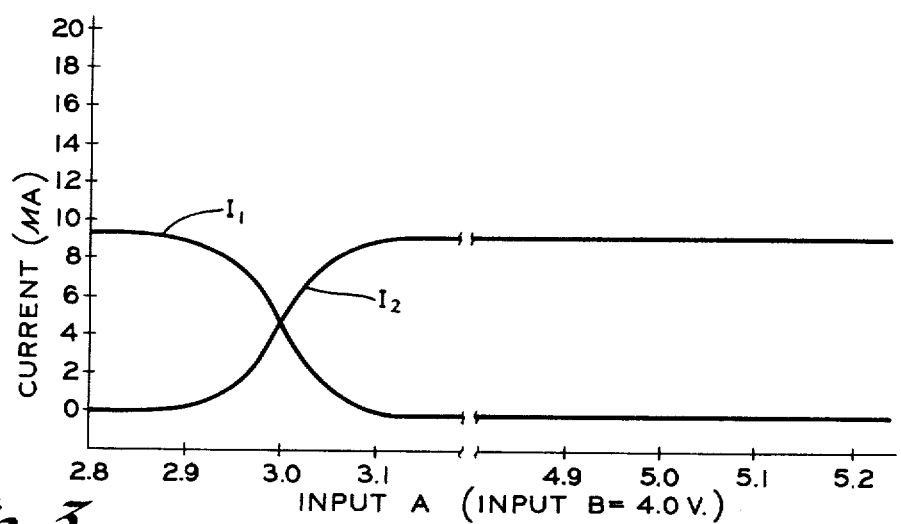
FIGS. 3, 4 and 5 are graphs useful in explaining the operation of the window detector.
Figure 4:
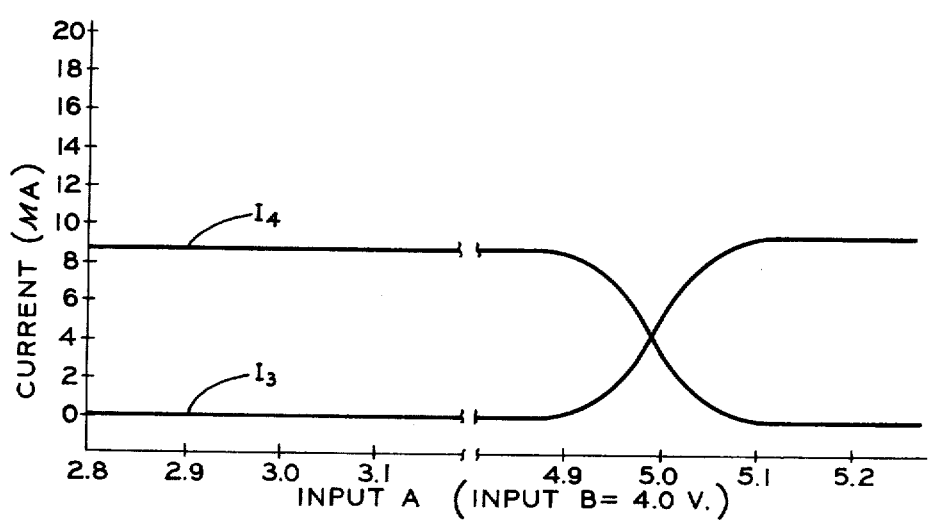
Figure 5:
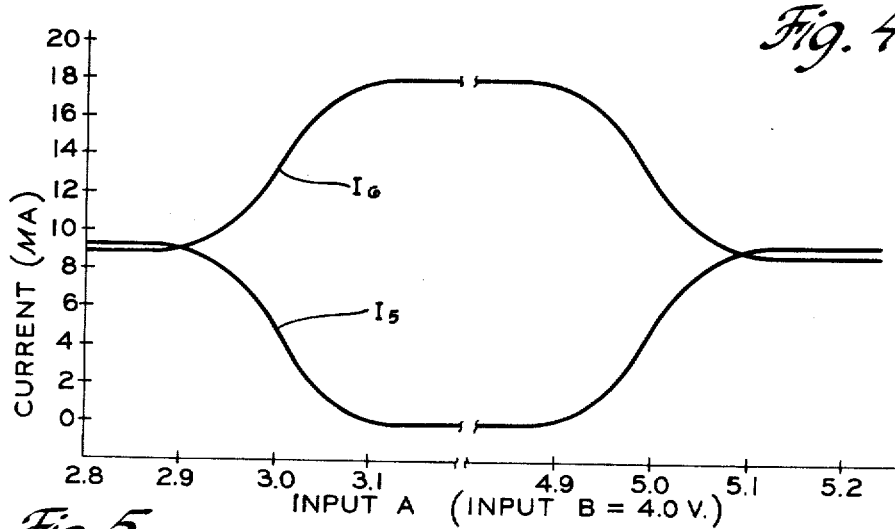

FIGS. 3, 4 and 5 show current variations as one of the input voltages, for example A, is varied while the other input B is maintained at 4 volts. As long as both inputs are between 3.1 and 4.9 volts transistor Q1 is off and transistor Q2 is fully conductive as shown in FIG. 3. Also, transistors Q6 and Q7 are off and transistors Q8 and Q9 are fully conductive as shown in FIG. 4. Thus, the combined current $I_5$ at the junction 64 is zero and the combined current $I_6$ at the junction 68 is approximately 18 $\mu$A as shown in FIG. 5. These values are mirrored to the transistors Q14 and Q15 by the current mirrors 66 and 70. The output current of Q15 is thus approximately 36 $\mu$A and is applied to the collector-base junction of Q17. Transistor Q16 will thus try to sink 36 $\mu$A but since no current is available from Q14, Q16 will saturate and pull the base of Q18 to ground. Transistor Q18 is thus turned off and the collector of Q18 is high.

If input A drops below the lower reference LV, for example to 2.9 volts, it will be noted from FIG. 3 that Q2 is turned off and Q1 is fully conductive and $I_5$ and $I_6$ are each approximately 9 $\mu$A as shown in FIG. 5. With the amplification provided by Q11 approximately 27 $\mu$A is supplied to Q14 and approximately 54 $\mu$A is available at the collector output of Q14. However, only 18 $\mu$A is available at the collector output of Q15 and accordingly Q16 will only sink 18 $\mu$A. The difference drives Q18 to saturation, causing the detector output at the collector of Q18 to go low. Similarly, if input A exceeds the 5 volt upper reference, $I_5$ and $I_6$ are again approximately 9 $\mu$A and the detector output is driven low. Thus, as long as both inputs A and B are within the window, Q16 sinks substantially all of the output current of Q14. This maintains Q18 in a cut-off state with the detector output high. If either input moves outside the window a differential is created in the output currents of Q14 and Q15 such that Q16 does not sink a sufficient amount of the Q14 output current to prevent Q18 from being driven to conduction and causing the detector output to go low.

The embodiments of the invention in which an exclusive property or privilege is claimed are defined as follows:

1. A window detector responsive to a plurality of separate inputs comprising:

voltage divider means establishing upper and lower voltage reference levels, a common emitter differential transconductance stage producing first and second output currents which are differentially related to the difference between said lower voltage reference level and the voltage level of the lowest of said inputs, a common base differential transconductance stage producing third and fourth output currents which are differentially related to the difference between said upper voltage reference level and the voltage level of the highest of said inputs, means for summing said first and third output currents and said second and fourth output currents to produce first and second combined output currents, means responsive to said first and second combined output currents for producing an output voltage at one level if all of said inputs are between said voltage reference levels and a second output if any one of said inputs is greater than said upper voltage reference level or less than said lower voltage reference level.

2. A window detector responsive to a plurality of separate inputs comprising:

voltage divider means establishing upper and lower voltage threshold references at first and second junctions respectively, first comparator means comprising first and second PNP transistor means, a current source connected to the emitters of each of said first and second transistor means, means applying said lower voltage reference to the base of said second transistor means, means controlling the base of said first transistor in accordance with the lower of said inputs, second comparator means comprising third and fourth PNP transistor means having a common base; a current source connected with said base; said third transistor means having a plurality of emitters for connection with respective ones of said inputs, at least one collector connected with said base, and at least one additional collector providing a first output of said second comparator means; said fourth transistor means having at least one emitter connected with said first junction, at least one collector connected with said base and at least one additional collector providing a second output of said second comparator means, means combining the collector currents of said first and third transistor means, means combining the collector currents of said second and fourth transistor means, means responsive to the relative magnitudes of said combined collector currents for producing a bi-level output which is at one level when all of said inputs are between said upper and said lower levels and which is at the other level when either of said inputs is above said upper reference or below said lower reference.

3. A window detector responsive to a plurality of separate inputs comprising:

voltage divider means establishing upper and lower voltage threshold references at first and second junctions respectively, first comparator means comprising first and second PNP transistor means, a current source connected to the emitters of each of said first and second transistor means, means applying said lower voltage reference to the base of said second transistor means, means controlling the base of said first transistor in accordance with the lower of said inputs, second comparator means comprising third and fourth PNP transistor means having a common base; a current source connected with said base; said third transistor means having a plurality of emitters for connection with respective ones of said inputs, at least one collector connected with said base, and at least one additional collector providing a first output of said second comparator means; said fourth transistor means having at least one emitter connected with said first junction, at least one collector connected with said base and at least one additional collector providing a second output of said second comparator means, means combining the collector currents of said first and third transistor means, means combining the collector currents of said second and fourth transistor means, a cross-coupled PNP pair of transistors, a first current mirror connected between said second and fourth transistor means and said cross-coupled PNP pair of transistors and providing an input current to one of said cross-coupled pair of transistors which is equal to the combined collector currents of said second and fourth transistor means, a second current mirror connected between said first and third transistor means and said cross-coupled PNP pair of transistors and providing an input current to the other of said cross-coupled pair of transistors which is equal to three times the combined collector currents of said first and third transistor means, and means producing a bilevel output which is a function of the relative magnitudes of the output currents of said cross-coupled PNP pair of transistors.

* * * * *